United States Patent [19]

Neidig et al.

[11] Patent Number: 4,727,454

[45] Date of Patent: Feb. 23, 1988

[54] SEMICONDUCTOR POWER MODULE

[75] Inventors: Arno Neidig, Plankstadt; Klaus Bunk, Worms, both of Fed. Rep. of Germany; Jens Gobrecht, Gebenstorf, Switzerland

[73] Assignee: Brown Boveri & Cie AG, Mannheim-Käfertal, Fed. Rep. of Germany

[21] Appl. No.: 59,135

[22] Filed: Jun. 4, 1987

Related U.S. Application Data

[63] Continuation of Ser. No. 693,653, Jan. 22, 1985, abandoned.

[30] Foreign Application Priority Data

Jan. 21, 1984 [DE]  Fed. Rep. of Germany ....... 3402003

[51] Int. Cl.$^4$ ............................................. H01L 23/24
[52] U.S. Cl. .................... 361/382; 165/80.4; 165/104.33; 174/15 HP; 357/82; 361/385
[58] Field of Search .............. 361/381, 383, 384, 385, 361/382; 357/82; 174/15 R, 15 HP; 165/104.33, 104.21, 104.26, 80.4

[56] References Cited

U.S. PATENT DOCUMENTS

| | | | |
|---|---|---|---|
| 3,361,195 | 1/1968 | Meyerhoff et al. | 361/385 |
| 3,651,865 | 3/1972 | Feldmanis | 361/385 |
| 3,971,435 | 7/1976 | Peck | 165/104.26 X |

OTHER PUBLICATIONS

Ronkese, "Centerless Ceramic Package with Directly Connected Heat Sink", IBM Tech. Disclosure Bulletin, vol. 20, No. 9, 2/78, pp. 3577–3578.
Brunsch et al., "Semiconductor Chip Cooling System with Temperature Regulation," IBM Tech. Disclosure Bulletin, vol. 24, No. 9, 2/82—pp. 4796–4797.

*Primary Examiner*—A. D. Pellinen
*Assistant Examiner*—Morris Ginsburg
*Attorney, Agent, or Firm*—Herbert L. Lerner; Laurence A. Greenberg

[57] ABSTRACT

A semiconductor power module includes a substrate formed of metallized ceramic, at least one semiconductor power component with a base surface soldered to the metallized ceramic, and at least one heat conduit integrated into the semiconductor power module. The heat conduit includes a condensation area having a larger surface than the base surface, over which dissipation heat from the semiconductor power component is distributed.

19 Claims, 7 Drawing Figures

SEMICONDUCTOR POWER MODULE

This application is a continuation of application Ser. No. 693,653, filed Jan. 22, 1985, now abandoned.

The invention relates to semiconductor power modules with one or more semiconductor power components soldered to a metallized ceramic substrate. This involves modules with power semiconductors mounted to a substrate in solder contact technology, in such a way as to be electrically insulated.

Such semiconductor power modules are known, for instance, from German Published, Non-Prosecuted Applications DE-OS Nos. 31 27 457 and 30 28 178, corresponding to U.S. application Ser. No. 762,802, filed Aug. 2, 1985 and U.S. Pat. No. 4,436,951, respectively. However, during the dissipation of high power losses from the active semiconductor parts, the high inner thermal impedance of the modules which is caused to a great extent by the insulating ceramic substrates, is disturbing. Modules containing semiconductor power components for continuous currents exceeding approximately 100 Amperes have so far been produced exclusively in pressure contact technology, because the problems of mismatching thermal expansions can be managed better with such technology.

However, modules produced by pressure contact technology require high material and assembly costs because the high pressures necessitate massive or solid constructions. In addition, in order to provide electrical insulation and low thermal impedance at the same time, expensive beryllium oxide is used which is toxic as a dust, thereby causing scrapping problems.

It is accordingly an object of the invention to provide a semiconductor power module which overcomes the hereinafore-mentioned disadvantages of the heretofore-known devices of this general type, to improve the heat dissipation in semiconductor power modules with substrates formed of metallized aluminum oxide ceramics and solderedon semiconductor power components and to reduce the inner thermal impedance between the active silicon part and the base of the housing. This results in considerable advantages through better utilization of the silicon surface and through lower cooling costs.

With the foregoing and other objects in view there is provided, in accordance with the invention, a semiconductor power module, comprising a substrate formed of metallized ceramic, at least one semiconductor power component with a base surface soldered to the metallized ceramic, and at least one heat conduit or pipe integrated into the semiconductor power module, the heat conduit including a condensation area having a larger surface than the base surface, over which dissipation heat from the semiconductor power component is distributed.

The invention proposes the improvement of the dissipated heat transport from a semiconductor component through an electrically insulating substrate to a heat sink by integrating a thermal tube into the module, preferably into the substrate, in order to distribute the heat over a larger substrate area. The thermal impedance can thereby be advantageously reduced.

Heat pipes or thermal tubes or conduits are known in general and are described in the publication BBC-Nachrichten, 1966, pages 206 through 211, for example. Such conduits involve a closed chamber which may be partly filled by a liquid. The material used for the wall and the kind of liquid used depend essentially upon the temperature range in which the heat pipe is to operate. When heat is supplied to one point of the heat pipe known as the heating zone, the liquid evaporates and the vapor spreads throughout the entire chamber. The vapor condenses at a heat sink, thereby giving off heat. The operating liquid must be transported back to the heating zone. This can be accomplished by means of gravity if the heat pipe is disposed in such a way that the heating zone is at the bottom and the heat sink is higher up. However, the return of the liquid can also be accomplished by the capillary effect, for which purpose the inside wall is provided with grooves or a porous layer. The heat pipe or conduit permits the heat to be transported from a heat source to a more remote and/or larger area heat sink but at a slight temperature drop. The chamber formed by the so-called heat pipe or conduit by no means must be cylindrical. A heat pipe or conduit may be of almost any shape.

In accordance with another feature of the invention, the metallized ceramic substrate includes a metallization disposed on a side of the substrate facing the semiconductor power component, the heat conduit or pipe being integrated into the metallization. This is done so that the heat flow will spread over as large an area of the poorly heatconducting ceramic as possible.

If the semiconductor power module is always used in a defined installed position, the heat pipe can be very simply constructed without a capillary structure because gravity will then take care of the return of the liquid. Such a heat pipe can be produced using a structured metal foil on a ceramic plate and a smooth metal foil as a cover foil over the structured foil.

In accordance with a further feature of the invention, the metallized ceramic substrate includes a ceramic plate, a structural metal foil disposed on the ceramic plate, and a substantially smooth metal foil disposed on the structured metal foil, the structured metal foil having metal surfaces defining continuous interspaces for vapor and fluid transport therebetween forming the heat conduit or pipe. The heat pipe can be provided with a capillary structure, making it possible to use the semiconductor power module in any desired installed position. Such a capillary structure can be etched into the cover foil.

In accordance with an added feature of the invention, the metallized ceramic substrate includes a ceramic plate, a structured metal foil disposed on the ceramic plate, and another metal foil having a side joined to the structured metal foil, the side of the other metal foil having capillaries formed therein forming the heat conduit. In accordance with an additional feature of the invention, the semiconductor power component is disposed on a given heating zone of the module, the metallized ceramic substrate includes a ceramic plate, a structured metal foil disposed on the ceramic plate, another ceramic plate disposed on the structed metal foil, the other ceramic plate having relatively larger openings formed therein in vicinity of the given heating zone and relatively smaller openings formed therein in vicinity of the condensation area, and another metal foil having a side facing the other ceramic plate, the side having capillaries formed therein emanating radially from the center of the heating zone forming the heat conduit or pipe.

In order to provide the metallization with a heat pipe having a capillary structure, a structure of inexpensive aluminum oxide ceramic may be provided within the heat pipe. This makes it possible to provide larger chambers for the vapor flow in the heating zone; in addition, the mechanical strength of the assembly is improved.

In accordance with again another feature of the invention, the metallized ceramic substrate includes a ceramic plate, a structured metal foil disposed on the ceramic plate, a porous ceramic plate disposed on the structured metal foil, and a substantially smooth metal foil disposed on the porous ceramic plate together forming the heat conduit or pipe.

In accordance with again a further feature of the invention, the metal foil includes copper.

In accordance with again an added feature of the invention, the metallized ceramic substrate includes a ceramic plate, and a metal foil having a structured side directly bonded to the ceramic plate, the side having channels for vapor transport and capillaries for fluid transport formed therein adjacent each other forming the heat conduit or pipe. This makes for a simple substrate construction when smaller power losses below about 100 W must be distributed.

In accordance with again an additional feature of the invention, there is provided a substantially smooth metal foil disposed on the lower surface of the ceramic plate.

In accordance with yet another feature of the invention, the ceramic plate and metal foil disposed thereon are interconnected by direct bonding.

Since a metallization constructed as a heat pipe must be tight and be able to withstand a certain vapor pressure, it is advantageous to use a substrate made by a direct-bonding method. This minimizes thermal expansion mismatching problems between the active silicon part and adjacent layers, because the ceramic essentially determines the coefficient of expansion.

In accordance with yet a further of the invention, there is provided deionized water acting as an operating fluid in the heat conduit or pipe.

In accordance with a concomitant feature of the invention, there is provided an inert fluid acting as an operating fluid in the heat conduit or pipe.

Although the invention is illustrated and described herein as embodied in a semiconductor power module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 6:
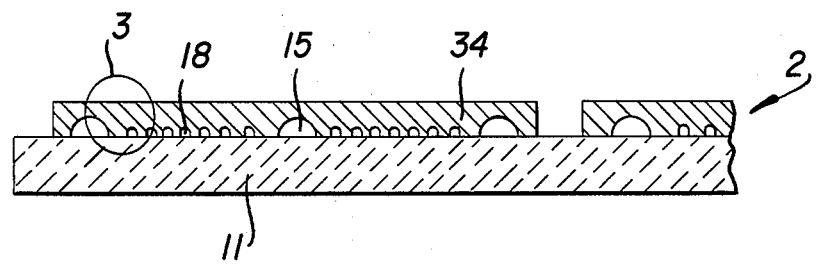
Figure 7:
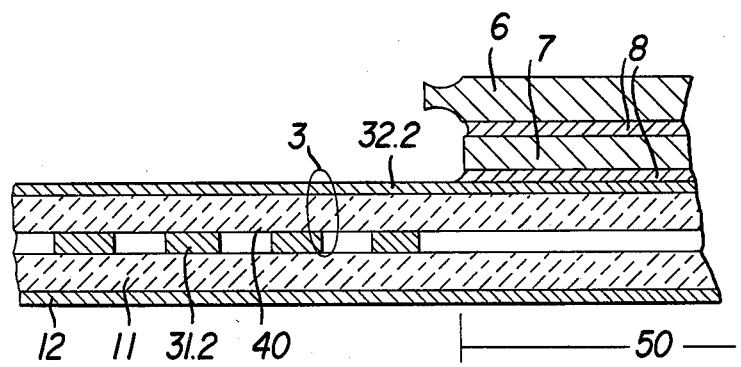

FIG. 6 is a fragmentary, cross-sectional view of a metallization on a ceramic plate constructed as a heat pipe with a capillary structure, the metallization being formed of only one foil which contains both capillaries and vapor channels according to a fourth embodiment of the invention; and FIG. 7 is another fragmentary, cross-sectional view of a metallization on a ceramic plate, constructed as a heat pipe with a capillary structure, having a porous ceramic plate acting as the capillary structure according to a fifth embodiment of the invention.

Figure 1:
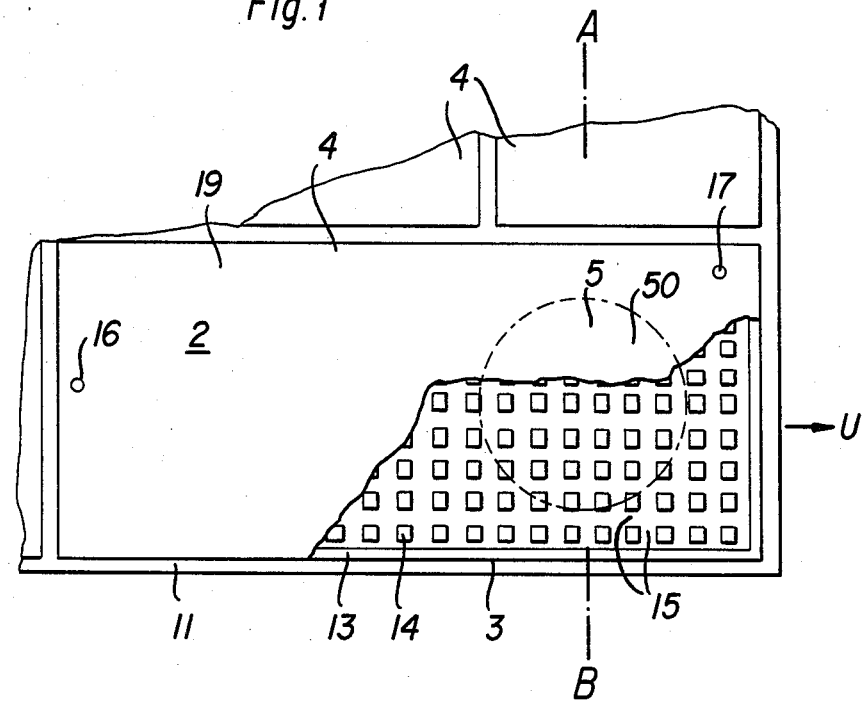
FIG. 1 is a fragmentary, diagrammatic, top-plan view, partly broken away, of a substrate with metallizations, constructed as a heat pipe without capillaries according to a first embodiment of the invention.

Referring now to the figures of the drawings in detail and first particularly to FIG. 1 thereof, there is seen a first embodiment of a substrate 2 with metallizations 4, some of which are constructed as heat pipes 3. A circle drawn in a broken line indicates an assumed heating zone 50 of a heat pipe 3. The zone 50 is the location at which the lower surfaces 5 of a semiconductor power component 6 is soldered on, as shown in FIG. 2.

Figure 2:
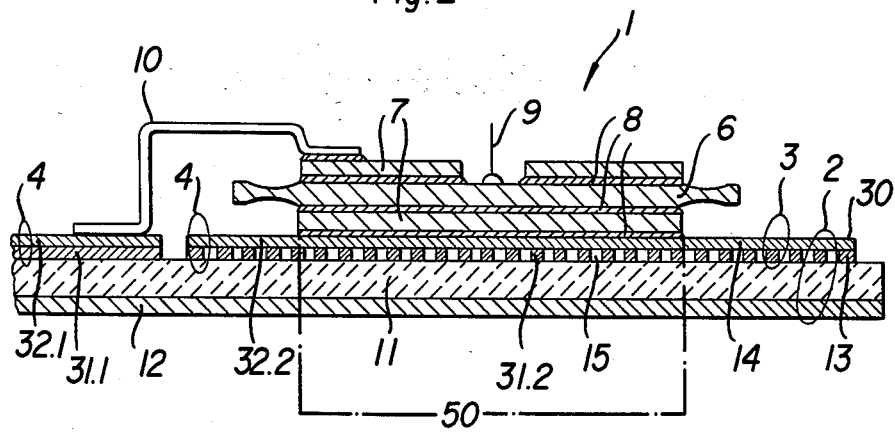
FIG. 2 is a fragmentary, cross-sectional view taken along the plane A-B in FIG. 1, of a substrate with a soldered-on thyristor.

FIG. 2 is a cross-sectional view taken along the plane A-B in FIG. 1. This section of a semiconductor power module 1 as illustrated in FIG. 2 shows a substrate 2 with two metallizations 4, the metallization shown on the right being constructed as a heat pipe or conduit 3. A so-called sandwich which is formed of a semiconductor power component 6 such as a thyristor, molybdenum contact circles 7, and solder films 8, and which has a gate terminal 9, is soldered onto the heat pipe 3. A contact bridge 10 connects the cathode side of the semiconductor component 6 to a metallization 4.

A further description of the embodiment shown in FIGS. 1 and 2 is contained in the following description of how the semiconductor power module 1 is produced.

The fabrication of the module begins with a ceramic plate 11 which is about 0.63 to 1.0 mm thick, on both sides of which copper foils 12, 31.1, 31.2, each of which is about 0.3 mm thick are joined by a direct bonding method. The copper foil 31.1, 31.2 on top of the ceramic plate 11 is etched in the area of the partial foil 31.2 which is deposited later, in such a way that square copper surfaces 14 having an edge length of about 0.4 mm remain within a closed rim 13. Masking used in screen-printing or silk-screen technology is suited for the etching operation. Spaces 15 between the copper surfaces 14 are about 0.6 mm wide.

In a second operation, another copper foil 32.1, 32.2 which is about 0.3 mm thick is applied to the structured copper foil 31.1, 31.2 by direct bonding. This produces a cavity needed for a heat pipe 3 which is in the form of the spaces 15 between the square copper surfaces 14.

In a third operation, the metallization 4 on the ceramic plate 11 formed of the copper foils 31.1, 31.2 and 32.1, 32.2 is etched in such a way that individual surfaces which are insulated from each other are formed in accordance with the strip conductor structure required for the respective module circuit. Entry openings 16 and exit openings 17 are simultaneously etched at suitable locations along the metallization 4 during this operation. These openings 16, 17 are needed in order to subsequently fill the heat pipe 3 with a liquid. The openings 16, 17 may also be produced in advance by stamping. In that case, the openings 16, 17 must be closed tightly by a suitable adhesive tape during the etching operation. When a heat pipe 3 is subsequently filled through the entry opening 16, displaced air escapes through the exit opening 17. However, if filling occurs by a vacuum method, the exit opening 17 is not needed.

In a fourth operation, the surfaces of the copper foils 32.1, 32.2 and possibly the foil 12 are coated with a metal which is suited for the next assembly steps. It is recommended, for example, to nickel plate the copper foils 32.1, 32.2 is semiconductor power components 6 are to be subsequently mounted by soft soldering. Nickel plating may occur either galvanically or currentlessly, i.e. chemically. It is expedient to close the openings 16, 17 with a foil in advance, in order to prevent protracted washing operations later.

Semiconductor power components 6 such as the sandwich shown in FIG. 2, including contact bridges 10 or other components such as contact terminals, are soldered on in a fifth operation. In this soldering operation, short plug nipples of nickel-plated brass or copper may be soldered onto the openings 16, 17 at the same time in order to facilitate subsequent filling in of the liquid.

After the conclusion of these operations associated with heat treatment, the liquid required for the heat transport is filled in during a sixth operation. Deionized water which has already been proven to be effective in low temperature heat pipes is preferred as the liquid, although inert fluids are also suitable. Filling in the fluid is simplified by heating the module 1 to about 90° to 95° C. in order to improve wetting. A simple injection syringe may be used for filling. The optimal amount to be filled in is determined by experimentation. The amount of fluid must be at least enough to ensure that the heat pipe heating zone does not dry out during operation. The pressure in the heat pipe is adjustable within certain limits through adjusting the temperature of the module 1 when closing the openings 16, 17. The nipples may be closed, such as by screwing, squeezing, or glueing.

Installation of the module 1 into a plastic housing and conventional sealing of the module 1 is performed as a seventh and final operation. The order in which the sixth and seventh steps are performed may be reversed if appropriately long filling nipples are provided.

The above-described heat pipes 3 which are integrated in the substrate 2 contain no capillary structure for the return of the operating fluid to the heating zone 50. Therefore, the finished and semiconductor power module 1 must indicate the installed position in which the module 1 is functional. The bottom of the device is indicated by reference symbol U and an arrow in FIG. 1.

Figure 3:
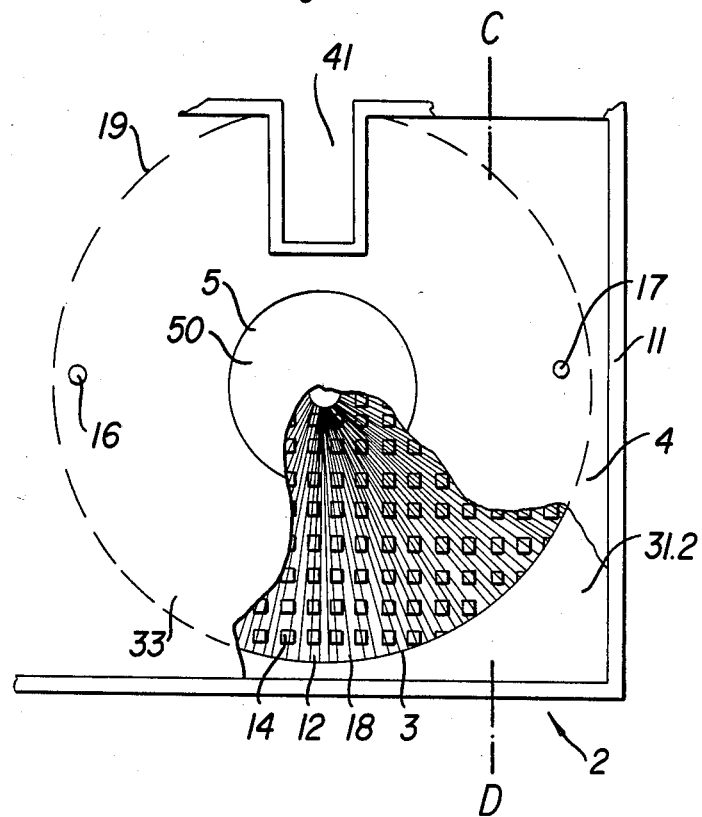
FIG. 3 is a fragmentary, top-plan view, partly broken away, of a substrate with metallization constructed as a heat pipe, with capillaries which radiate from the heating zone fo the heat pipe according to a second embodiment of the invention.
Figure 4:
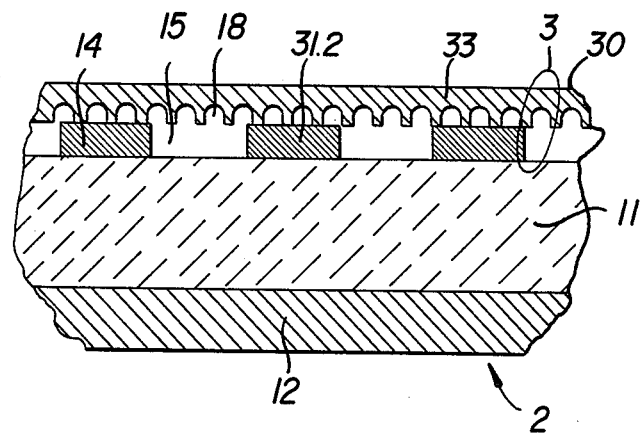
FIG. 4 is a cross-sectional view of the substrate taken along the plane C-D in FIG. 3.

A second embodiment is illustrated in FIGS. 3 and 4. The second embodiment involves the integration of a heat pipe 3 provided with capillaries 18 into the substrate 2 of a semiconductor power module 1 which can be used in any installed position.

FIG. 3 shows a top-plan view of a cutout of a semiconductor power module 1. This module 1 also starts with a ceramic plate 11 which is about 0.63 to 1.0 mm thick having a lower surface which is bonded to a copper foil 12 that is about 0.3 mm thick and an upper surface which is bonded to a copper foil 31.2 that is about 0.4 mm thick. The upper foil 31.2 is etched as in the first embodiment so that a large, round condensation area remains, as is indicated by a broken line, having square surfaces 14 and spaces 15 therebetween. The circle indicating the condensation area 19 describes the outer limit of the heat pipe 3 whose heating zone 50 is indicated by the smaller concentric circle. The base surface 5 of the non-illustrated semiconductor power component 6 which matches the area of the heating zone 50, is soldered to the heating zone 50 on the metallization 4, marked by the small circle. The metallization 4 thus is at anode potential, for example. As shown in FIG. 3, the adjacent metallization surface 4.1, which is electrically insulated from the metallization 4, may be extended close to the semiconductor power component 6, permitting the use of a short contact bridge 10 (as shown in FIG. 2) between the cathode of the semiconductor power component 6 and the metallization 4.1.

Radial lines in FIG. 3 indicate the structure of capillaries 18 which are actually not visible from above because the capillaries 18 are located on the lower surface of a copper foil 33 of the metallization 4, which is broken away in the drawing. The capillaries 18 run radially to make it possible for the fluid to flow to the heating zone 50 from all sides.

FIG. 4 shows a section taken along the plane C-D in FIG. 3. It will be seen by comparison with the cross-sectional view of FIG. 2, that the sole structural difference between the figures is that the upper copper foil 33 has capillaries 18 on its lower surface facing the foil 31.2. The capillaries 18 for transporting the fluid should be about 0.1 mm wide and deep and the thickness of the foil 33 should be about 0.3 mm. The structure of the radial capillaries 18 in the foil 33 has been produced earlier by etching. The capillaries 18 should by closely juxtaposed, even in the outer zone of the condensation area 19. Therefore, the capillaries 18 must terminate in adjacent capillaries 18 toward the inside.

The production of the second embodiment of the semiconductor power module 1 as illustrated in FIGS. 3 and 4 or the production of the substrate 2 required for the module, with an integrated heat pipe or conduit 3 in the metallization 4, proceeds as described above in connection with the first embodiment illustrated in FIGS. 1 and 2. The only difference is that instead of the smooth foil 32.1, 32.2, the foil 33 which is unilaterally provided with capillaries 18, is used in the second step of the method.

Figure 5:
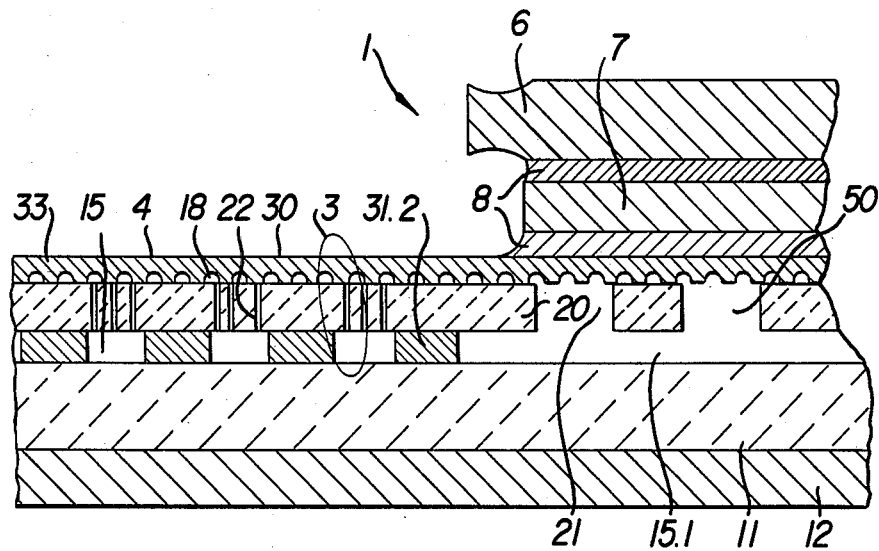
FIG. 5 is a fragmentary, cross-sectional view of a metallization on a ceramic plate constructed as a heat pipe with a capillary structure, having a second structured ceramic plate being contained within the metallization, according to a third embodiment of the invention.

A third embodiment is illustrated in FIG. 5. FIG. 5 shows a sectioned view similar to FIG. 2 or FIG. 4.

In the third embodiment of a semiconductor power module 1, a metallization 4 with an integrated heat pipe or conduit 3 having capillaries 18 is provided as in the second embodiment. However, in the third embodiment a second ceramic plate 20 is installed in vicinity of the heat pipe 3 or of the entire metallization 4, between the structured foil 31.2 and the foil 33 having the capillaries 18. This step is again performed by direct bonding during the second operation prior to the application of the foil 33. The ceramic plate 20 provides greater stability and permits the use of larger vapor chambers in vicinity of the heating zone 50. This is particularly advantageous when the power loss of the semiconductor power component 6 is high. In the heating zone 50 of the heat pipe 3, i.e. under the semiconductor power component 6, the ceramic plate 20 has relatively larger openings 21 having a diameter of e.g. 1 to 2 mm. In this area of the heating zone, the foil 31.2 under the zone is etched away completely so that an enlarged space 15.1 is formed. Outside of the heating zone 50, i.e. in the rest of the condensation area 19, the ceramic plate 20 has relatively smaller openings 22 which are about 0.1 mm in diameter. Thus, the fluid can be transported by the capillary effect from the interspaces 15 in the foil 31.2 through the openings 22 and then through the capillaries 18 in the foil 33 to the heating zone 50 under the component 6. As in FIG. 3, the capillaries 18 run radially toward the center of the heating zone 50, although this cannot be seen in FIG. 5.

In all of the embodiments, the respectively indicated extent of the condensation area 19 also includes the area in which the heating zone 50 is disposed above it. This is because the ceramic plate 11 also cools the area of the heating zone 50 which is heated from above by the semiconductor power component 6.

FIG. 6 is a cross-sectional view of a substrate 2 which illustrates a fourth embodiment of a heat pipe or conduit 3 integrated in the substrate 2. In FIG. 6, both capillaries 18 and vapor channels 15 are etched next to each other in a metal foil 34, and the etched side of this metal foil 34 is bonded directly to a ceramic plate 11.

A fifth embodiment is illustrated in FIG. 7. In FIG. 7, a structured metal foil 31.2 which is completely etched away in the area of the heating zone 50 is provided above the ceramic plate 11. Above the foil 31.2 is a porous ceramic plate 40 and finally, above the plate 40 is a smooth metal foil 32.2. The operating fluid is transported back to the heating zone 50 through the porous ceramic plate 40.

It goes without saying that the above-mentioned embodiments involve structural possibilities which are used by way of example only. Optimal dimensions for a given application are to be determined by computation and experimentation. Other structures for the construction of heat pipes or conduits 3 are possible, as is the use of other materials, operating fluids and technologies for bonding metals to ceramics. Besides direct bonding, soldering or brazing are other examples of suitable methods (on the basis of thick-film metallized ceramic plates).

The invention is not restricted to modules with several components, but instead is also suited for the insulated mounting of individual components.

What is claimed is:

1. Semiconductor power module comprising a substrate formed of ceramic, a metallization disposed on said substrate, at least one semiconductor power component with a base surface soldered to said metallization, at least one heat conduit integrated into said metallization, said heat conduit being in the form of a closed, evacuated chamber having a given volume, and operating fluid disposed in said chamber having a volume smaller than said given volume of said chamber, and said heat conduit including a condensation area having a larger surface than said base surface, over which dissipation heat from said semiconductor power component is distributed.

2. Semiconductor power module according to claim 1, including deionized water acting as said operating fluid in said heat conduit.

3. Semiconductor power module according to claim 1, including an inert fluid acting as said operating fluid is said heat conduit.

4. Semiconductor power module, comprising a substrate formed of metallized ceramic, at least one semiconductor power component with a base surface soldered to said metallized ceramic, said metallized ceramic substrate including a ceramic plate, a structured metal foil disposed on said ceramic plate, and a substantially smooth metal foil disposed on said structured metal foil, said structured metal foil having metal surfaces defining continuous interspaces for vapor and fluid transport therebetween forming a heat conduit integrated into the semiconductor power module, said heat conduit including a condensation area having a larger surface than said base surface, over which dissipation heat from said semiconductor power component is distributed.

5. Semiconductor power module according to claim 4, including a substantially smooth metal foil disposed on the lower surface of said ceramic plate.

6. Semiconductor power module according to claim 4, wherein said ceramic plate and metal foil disposed thereon are directly interconnected.

7. Semiconductor power module according to claim 4, wherein said metal foil includes copper.

8. Semiconductor power module, comprising a substrate formed of metallized ceramic, at least one semiconductor power component with a base surface soldered to said metallized ceramic, said metallized ceramic substrate including a ceramic plate, a structured metal foil disposed on said ceramic plate, and another metal foil having a side joined to said structured metal foil, said side of said other metal foil having capillaries formed therein forming a heat conduit integrated into the semiconductor power module, said heat conduit including a condensation area having a larger surface than said base surface, over which dissipation heat from said semiconductor power component is distributed.

9. Semiconductor power module according to claim 8, including a substantially smooth metal foil disposed on the lower surface of said ceramic plate.

10. Semiconductor power module according to claim 8, wherein said ceramic plate and metal foil disposed thereon are directly interconnected.

11. Semiconductor power module, comprising a substrate formed of metallized ceramic, at least one semiconductor power component with a base surface soldered to said metallized ceramic, said semiconductor power component being disposed on a given heating zone of the module, said metallized ceramic substrate including a ceramic plate, a structured metal foil disposed on said ceramic plate, another ceramic plate disposed on said structured metal foil, said other ceramic plate having relatively larger openings formed therein in vicinity of said given heating zone, and another metal foil having a side facing said other ceramic plate, said side having capillaries formed therein emanating radially from the center of said heating zone forming a heat conduit integrated into the semiconductor power module, said heat conduit including a condensation area having a larger surface than said base surface, over which dissipation heat from said semiconductor power component is distributed, said other ceramic plate having relatively smaller openings formed therein in vicinity of said condensation area.

12. Semiconductor power module according to claim 11, including a substantially smooth metal foil disposed on the lower surface of said first-mentioned ceramic plate.

13. Semiconductor power module according to claim 11, wherein said ceramic plates and metal foils disposed thereon are directly interconnected.

14. Semiconductor power module, comprising a substrate formed of metallized ceramic, at least one semiconductor power component with a base surface soldered to said metallized ceramic, said metallized ceramic substrate including a ceramic plate, a structured metal foil disposed on said ceramic plate, a porous ceramic plate disposed on said structured metal foil, and a substantially smooth metal foil disposed on said porous ceramic plate together forming a heat conduit integrated into the semiconductor power module, said heat conduit including a condensation area having a larger surface than said base surface, over which dissipation heat from said semiconductor power component is distributed.

15. Semiconductor power module according to claim 14, including a substantially smooth metal foil disposed on the lower surface of said ceramic plate.

16. Semiconductor power module according to claim 14, wherein said ceramic plate and metal foil disposed thereon are directly interconnected.

17. Semiconductor power module, comprising a substrate formed of metallized ceramic, at least one semiconductor power component with a base surface soldered to said metallized ceramic, said metallized ceramic substrate including a ceramic plate, and a metal foil having a structured side directly bonded to said ceramic plate, said side having channels for vapor transport and capillaries for fluid transport formed therein adjacent each other forming a heat conduit integrated into the semiconductor power module, said heat conduit including a condensation area having a larger surface than said base surface, over which dissipation heat from said semiconductor power component is distributed.

18. Semiconductor power module according to claim 17, including a substantially smooth metal foil disposed on the lower surface of said ceramic plate.

19. Semiconductor power module according to claim 17, wherein said ceramic plate and metal foil disposed thereon are directly interconnected.

* * * * *